US006209979B1

(12) United States Patent
Fall et al.

(10) Patent No.: US 6,209,979 B1
(45) Date of Patent: Apr. 3, 2001

(54) TELESCOPING SLIDE WITH QUICK-MOUNT SYSTEM

(75) Inventors: Maxwell Scott Fall, Indianapolis; William B. Greenwald, Beech Grove; Carl Edward Hansen, Greenfield, all of IN (US)

(73) Assignee: General Devices Co., Ltd., Indianapolis, IN (US)

( * ) Notice: Subject to any disclaimer, the term of this patent is extended or adjusted under 35 U.S.C. 154(b) by 0 days.

(21) Appl. No.: 09/596,375

(22) Filed: Jun. 19, 2000

Related U.S. Application Data
(60) Provisional application No. 60/183,932, filed on Feb. 22, 2000.

(51) Int. Cl.[7] .................................................. A47B 88/04
(52) U.S. Cl. .................. 312/330.1; 312/333; 312/334.8; 312/319.1
(58) Field of Search ............................. 312/330.1, 223.2, 312/333, 334.1, 334.7, 334.8, 334.22, 334.44, 223.1, 311, 270.3, 319.1, 215, 222, 301, 302, 323; 211/26; 292/304; 70/59

(56) References Cited

U.S. PATENT DOCUMENTS

| | | | |
|---|---|---|---|
| 516,583 | * 3/1894 | Adkins | 312/334.8 |
| 1,698,252 | * 1/1929 | Ashe | 312/333 X |
| 2,749,200 | * 6/1956 | Kuss | 312/334.8 X |
| 2,809,086 | * 10/1957 | Fall | 312/334.8 X |
| 4,423,914 | 1/1984 | Vander Ley | 312/333 |
| 4,441,772 | 4/1984 | Fielding et al. | 312/330.1 |
| 5,199,777 | 4/1993 | Taima et al. | 312/319.1 |
| 5,292,198 | 3/1994 | Röck et al. | 384/21 |
| 5,405,195 | 4/1995 | Hobbs | 312/334.46 |
| 5,433,517 | 7/1995 | Fleisch | 312/334.8 |
| 5,580,138 | 12/1996 | Grabher | 312/319.1 |
| 5,620,244 | 4/1997 | Yang | 312/333 |
| 5,632,542 | 5/1997 | Krivec | 312/334.7 |
| 5,671,988 | 9/1997 | O'Neill | 312/334.44 |
| 5,683,159 | 11/1997 | Johnson | 312/334.7 |
| 5,730,514 | 3/1998 | Hashemi | 312/333 |
| 5,823,648 | 10/1998 | Domenig | 312/334.5 |
| 5,904,412 | 5/1999 | Lammens | 312/334.7 |
| 6,027,194 | 2/2000 | Fleisch | 312/348.4 |

\* cited by examiner

Primary Examiner—James O. Hansen
(74) Attorney, Agent, or Firm—Barnes & Thornburg

(57) ABSTRACT

A telescoping slide assembly (10) is provided for the mounting of an equipment mounting support and includes an elongated stationary slide member (20) having two ends and an elongated movable load-carrying slide member (24) having two ends. The load-carrying slide member (24) is telescopically connected to stationary slide member (20) so as to have one end of the load-carrying slide member extended away from one end of the stationary slide member in an extended position and the one end of the load-carrying slide member movable telescopically with respect to the stationary slide member to a retracted position wherein the one end of the load-carrying slide member is telescopically withdrawn into the stationary slide member so as to be located adjacent to the one end of the stationary slide member. The load-carrying slide member (24) is provided with at least two post-engaging slots (16) and the load-carrying slide member post-engaging slots (16)are provided with a support surface (19) adapted to receive and support mounting posts (14) on an equipment mounting support to provide a coupling for the equipment mounting support to the telescopic slide assembly (10).

39 Claims, 9 Drawing Sheets

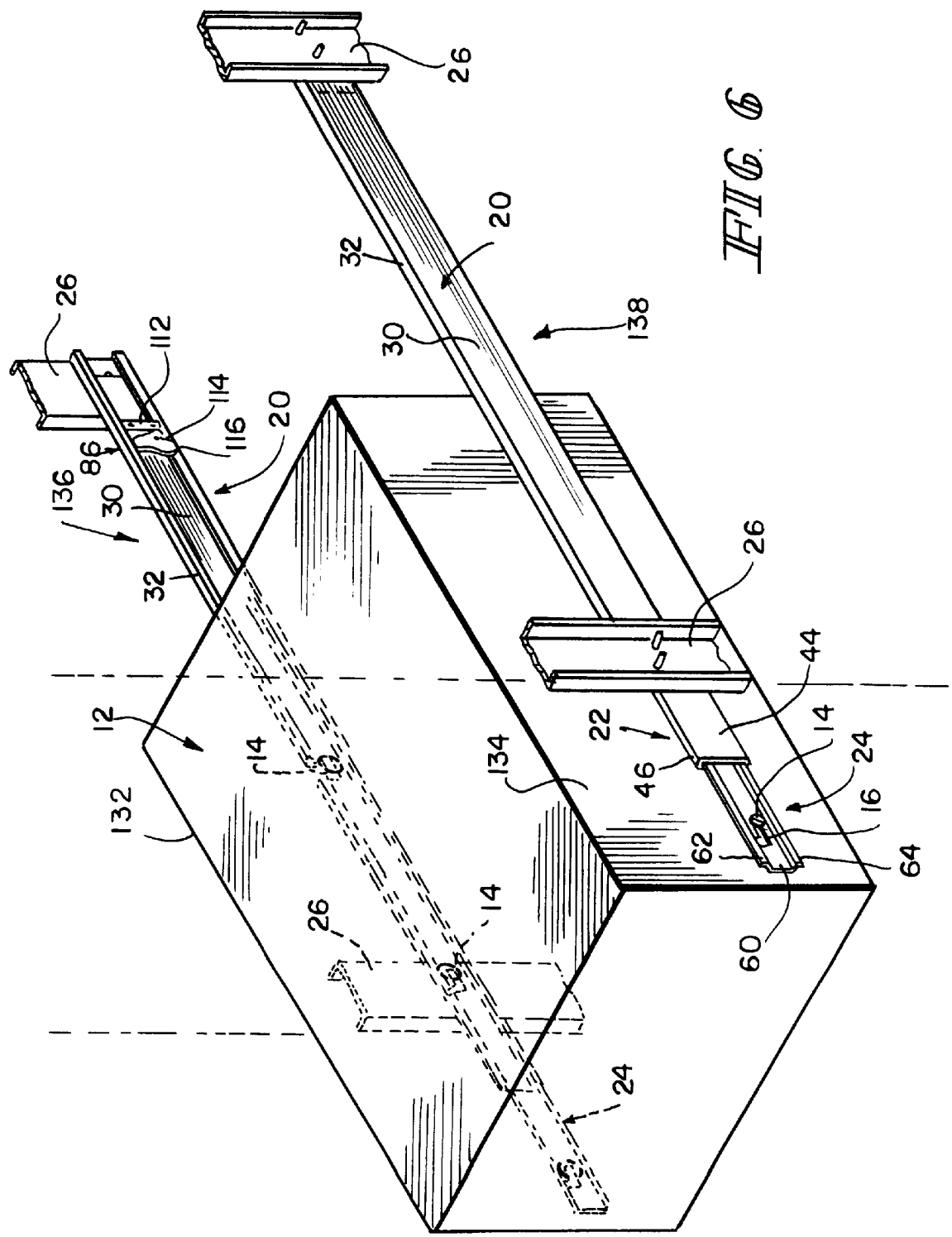

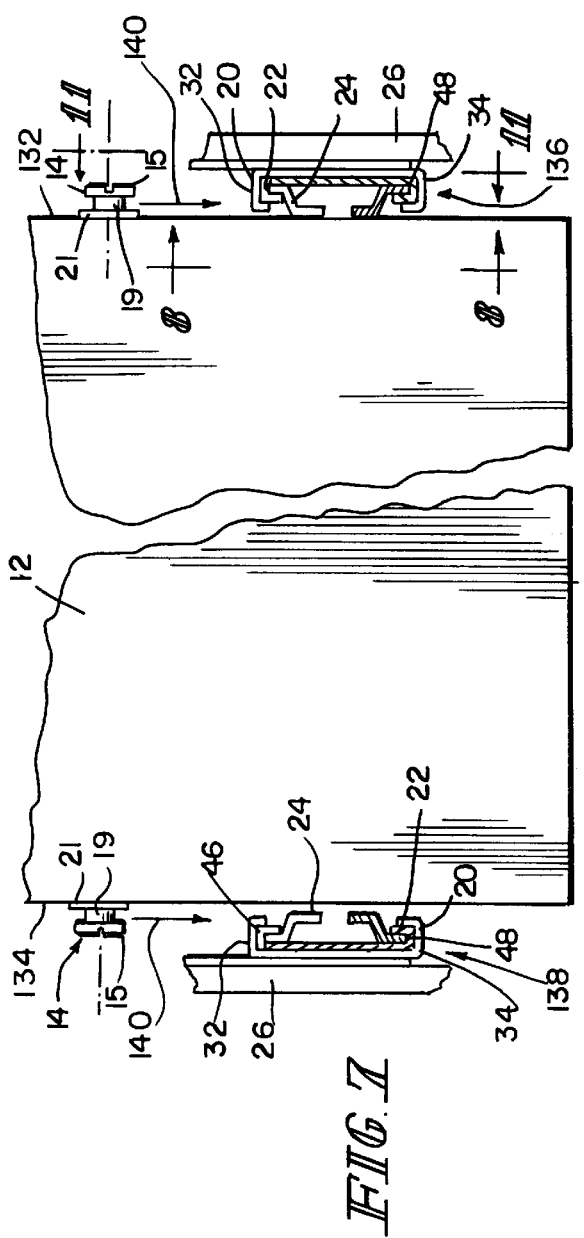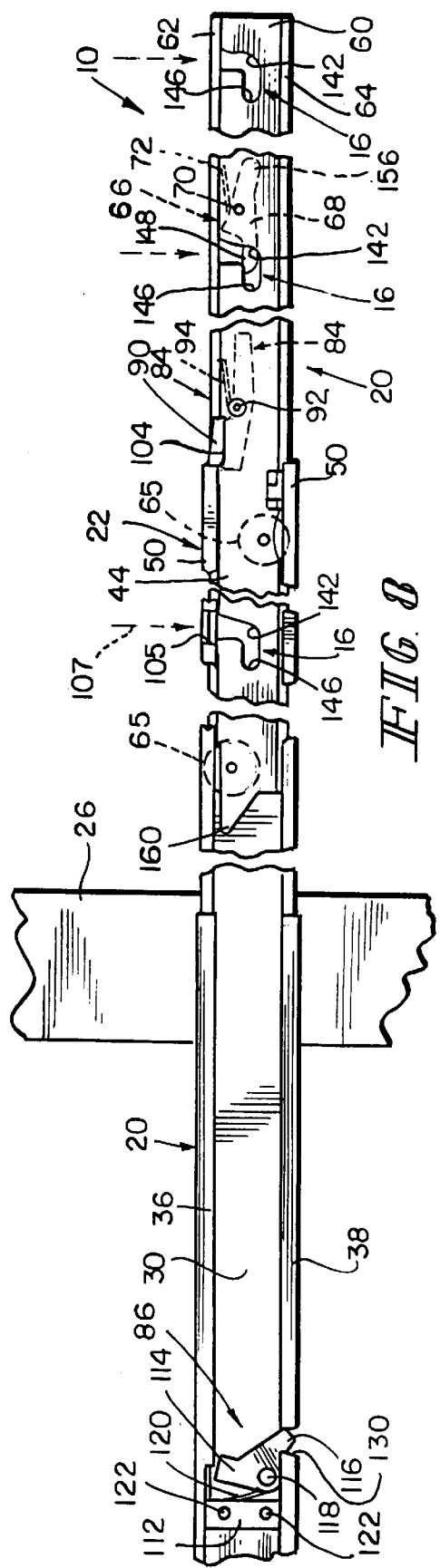

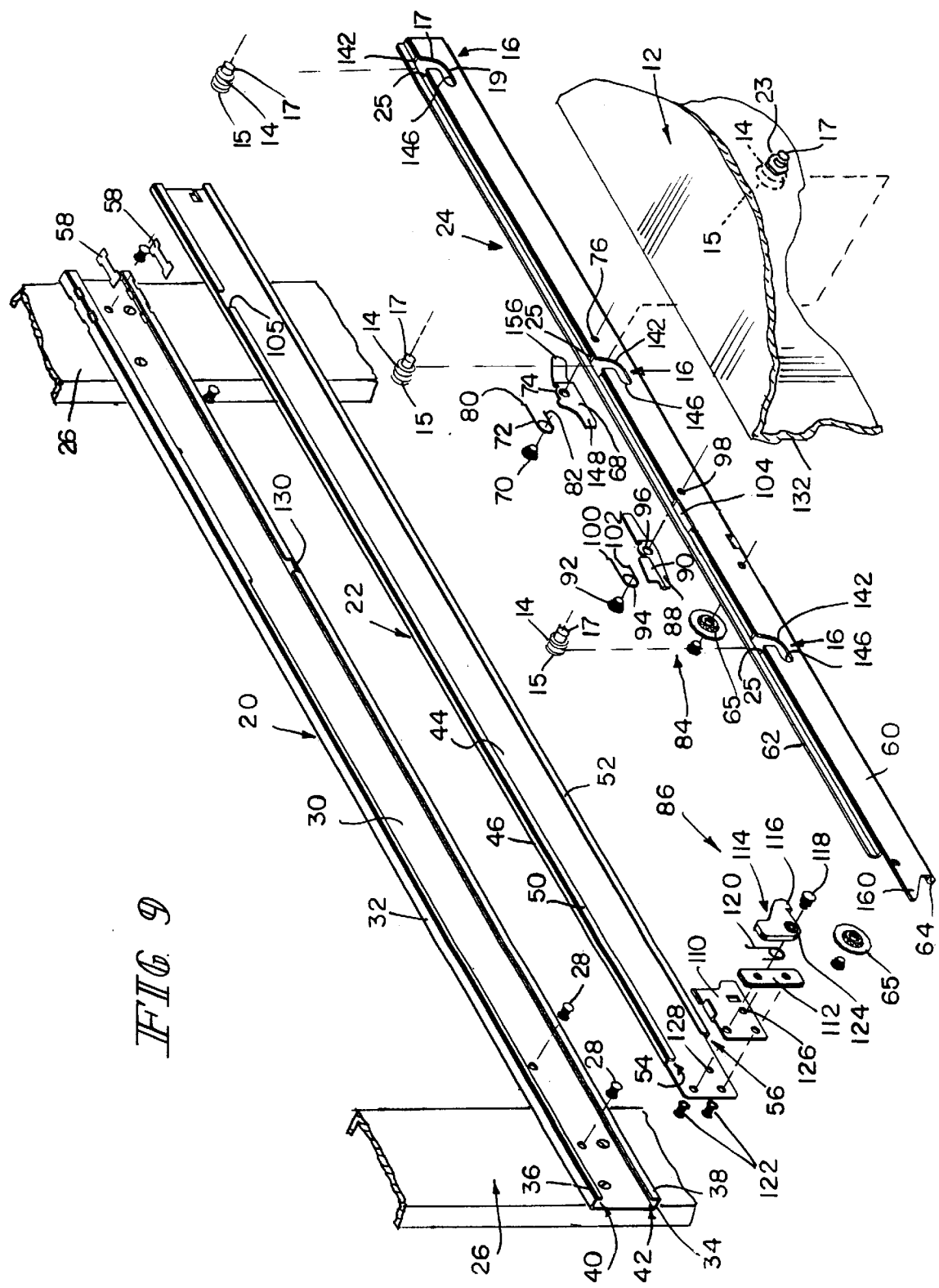

TELESCOPING SLIDE WITH QUICK-MOUNT SYSTEM

This application claims priority under 35 U.S.C. 119(e) to U.S. Provisional Application Ser. No. 60/183,932, filed Feb. 22, 2000, which is expressly incorporated by reference herein.

BACKGROUND AND SUMMARY OF THE INVENTION

The present invention relates to telescoping slide assemblies, and particularly to a slide assembly having at least two telescoping slide members. More particularly, the present invention relates to a pair of spaced-apart telescoping slide assemblies which are adapted to be releasably coupled to a piece of equipment, known as a chassis, which is positioned to lie therebetween.

Installation of a piece of electronic, console equipment or other hardware unit on a telescoping slide assembly mounted in an enclosure or hardware cabinet is accomplished using various installation tools and perhaps two or more technicians. Other types of equipment are also mounted on telescoping slide assemblies using various connectors and tools.

According to the present invention, a telescoping slide assembly includes a load-carrying slide member formed to include a slot adapted to receive a mounting post coupled to a piece of equipment and a latch coupled to the load-carrying slide member. The latch is arranged to move from a slot-closing position blocking exit of a mounting post in the slot from the slot (to retain the chassis carrying the mounting post on the load-carrying slide member) to a slot-opening position allowing movement of that mounting post into and out of the slot (to allow the chassis to be dismounted from the load-carrying slide member).

In preferred embodiments, the slot is L-shaped and includes a vertically extending entry portion and a horizontally extending post-retainer portion. The latch includes a lock body that is pivotably mounted on the load-carrying slide member and loaded by a spring to cause a tip portion of the lock body to extend across the width of L-shaped slot to block a mounting post received in the horizontally extending post-retainer portion from exiting the slot. The load-carrying slide member is included in a telescoping slide assembly having two or more slide members.

A chassis (such as a server) includes three mounting posts coupled to a left side wall of the chassis and three more mounting posts coupled to a right side wall of the chassis. Each mounting post includes an anchor coupled to the chassis side wall and a throat sized to move through the L-shaped slot to reach the post-retainer portion.

A pair of telescoping slide assemblies are mounted in a computer hardware cabinet and positioned to lie in side-by-side spaced-apart parallel relation so that the chassis will lie between the load-carrying slide member in each of the two telescoping slide assemblies. The three mounting posts on the left side wall of the chassis can be moved into three companion L-shaped slots formed in the load-carrying slide member of the left-side telescoping slide member while simultaneously the three mounting posts on the right side wall of the chassis are being moved into three companion L-shaped slots formed in the load-carrying slide member of the right-side telescoping slide assembly. A latch is pivotably mounted to lie adjacent to one of the L-shaped slots formed in each of the telescoping slide assemblies and arranged to open and then close automatically in response to movement of mounting posts in the two selected "lockable slots" to retain those mounting posts in "locked positions" in the post-retainer portions of those slots to mount the chassis securely on the load-carrying slide members without using tools and using a quick, drop-in installation procedure that may be accomplished by a single technician.

Features of the present invention will become apparent to those skilled in the art upon consideration of the following detailed description of preferred embodiments exemplifying the best mode of carrying out the invention as presently perceived.

BRIEF DESCRIPTION OF THE DRAWINGS

The detailed description particularly refers to the accompanying figures in which:

FIGS. 4–6 show movement of the chassis on the telescoping slide assemblies (from a fully extended position shown in FIG. 4) toward a stored position in the cabinet wherein FIG. 5 shows movement of the chassis-support slide into the intermediate slide and FIG. 6 shows movement of the chassis-support and intermediate slides (together as a unit) into the stationary slide fixed to a rack mounted inside the cabinet;

FIG. 7 is a partial front elevation view of the chassis shown in FIG. 2 as it is being lowered into place between the two specially adapted chassis-support slides of the telescoping slide assemblies;

FIG. 8 is a side elevation view taken along lines 8—8 of FIG. 7 showing one of the telescoping slide assemblies in a fully extended position and showing the "phantom-line tracks" to be followed by the three mounting posts as they are inserted into the three post-receiving slots formed in the fully extended chassis-support slide;

FIG. 9 is a perspective assembly view showing the components of the telescoping slide assembly shown in FIG. 8 prior to assembly and showing a portion of the chassis that will be mounted onto the chassis-support slide of the telescoping slide assembly;

FIG. 11 is an enlarged elevation view taken generally along line 11—11 of FIG. 7 showing an operator manually lowering the chassis to position mounting posts coupled to the chassis above openings into two of the three L-shaped post-receiving slots in the chassis-support slide;

FIG. 12 is a view similar to FIG. 11 showing movement of two of the mounting posts to reach the bottom of a "vertical leg" of the L-shaped post-receiving slots and movement of one of the mounting posts on a curved contact surface included in the post-locking latch mounted to lie adjacent to one of the L-shaped post-receiving slots to pivot that latch about a pivot axis to compress a spring to allow that mounting post to be moved (as shown in FIG. 13) forwardly into a "horizontal leg" of the L-shaped post-receiving slot;

FIG. 13 is a view similar to FIGS. 11 and 12 showing return of the post-locking latch (under a return force applied by the spring acting against the chassis-support slide) to a normal slot-closing position to block removal of the mounting post from the horizontal leg of the L-shaped post-receiving slot so that the chassis is locked in a fixed position on the chassis-support slide (yet releasable therefrom as shown, for example, in FIG. 14)

DETAILED DESCRIPTION OF THE DRAWINGS

Figure 1:
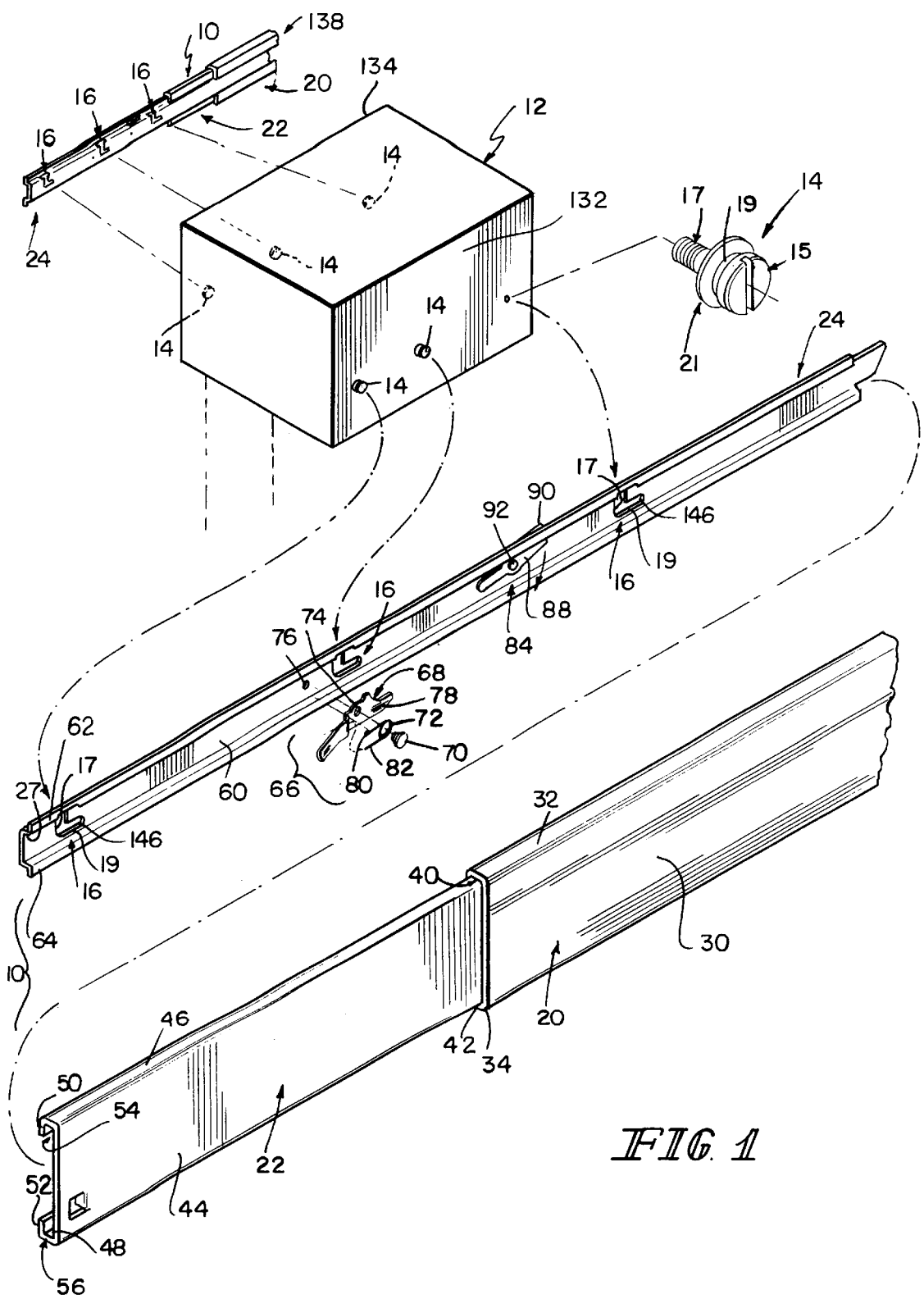
FIG. 1 is a perspective assembly view showing a piece of equipment, known as a "chassis," outfitted with six mounting posts and showing formation of three "L-shaped" post-receiving slots in the load-carrying chassis-support slides of two three-part telescoping slide assemblies and also showing a latch adapted to be mounted on a chassis-support slide adjacent to one of the L-shaped post-receiving slots and configured to operate automatically to lock one mounting post in position in each of the telescoping slide assemblies (as shown, for example, in FIGS. 11–13)
Figure 2:
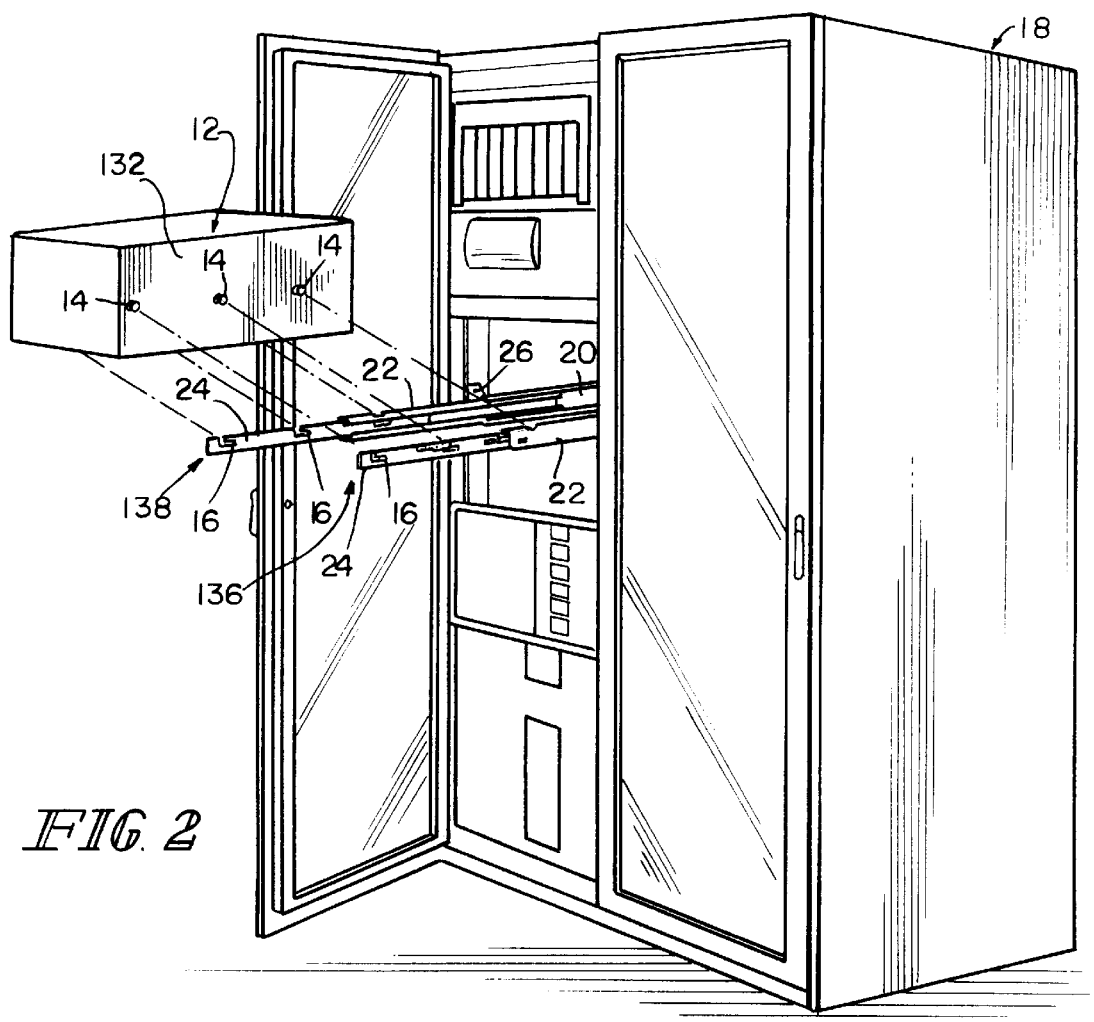
FIG. 2 is a perspective view of the chassis (e.g., a server) shown in FIG. 1 before the chassis is mounted onto two fully extended telescoping slide assemblies fixed in a cabinet.
Figure 3:
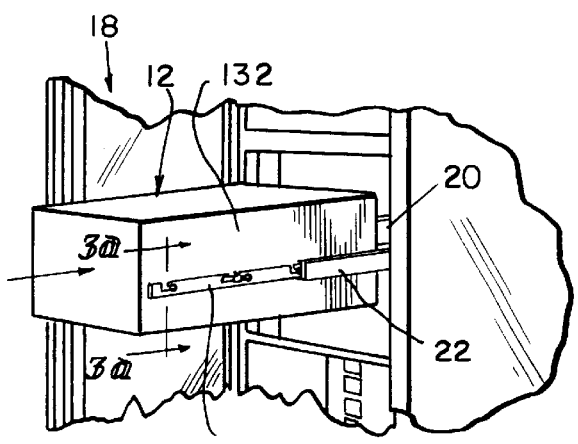
FIG. 3 is a perspective view similar to FIG. 2 showing the chassis mounted on the slide assemblies just before the chassis is pushed inwardly (in the direction of the arrow) into a stored position within the cabinet.

Mounting posts 14 are coupled to a chassis 12 and adapted to be coupled to chassis-support slides 24 included in a pair of telescoping slide assemblies 10 mounted to lie in spaced-apart parallel relation to one another in a cabinet 18 as shown, for example, in FIGS. 1–3 to permit a user to mount and dismount the chassis 12 quickly and easily. In the illustrated embodiment, cabinet 18 includes a rack of computer equipment, and chassis 12 is sized to be mounted on the telescoping slide assemblies 10 to permit technicians to gain access to the chassis by moving it out of cabinet 18 on telescoping slide assemblies 10. Installation and replacement of such a chassis is quick and easy because of the way in which mounting posts 12 are released from "drop-and-lock" positions in L-shaped slots 16 formed in each of the two chassis-support slides 24 (i.e., load-carrying slide members) included in the telescoping slide assemblies 10.

A telescoping slide assembly 10 is arranged to be mounted on a rack to lie in side-by-side parallel relation with another telescoping slide assembly 10 so that a chassis 12 can be carried on the pair of side-by-side telescoping slide assemblies 10 (136, 138) as shown, for example, in FIGS. 3–6. Chassis 12 is outfitted with six mounting posts 14 as shown in FIG. 1. It is within the scope of this disclosure to use more or less than six mounting posts. Each mounting post 14 is sized to be received within an "L-shaped" post-receiving slot 16 of each assembly 10 in order to mount chassis 12 to telescoping slide assemblies 10.

Figure 10B:
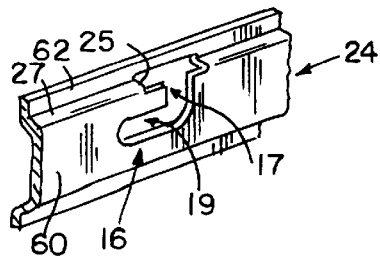
FIG. 10b is a perspective view of the portion of chassis-support slide of FIG. 10a (taken from the opposite side—see FIG. 9) showing a back wall that includes the L-shaped post-receiving slot, a horizontally extending flange that includes a wide inlet opening sized to receive the enlarged head of the companion mounting post, and an upper lip extending upwardly from a back edge of the horizontally extending flange and showing that the width of the L-shaped slot formed in the back wall is less than the width of the inlet opening formed in the flange.
Figure 10A:
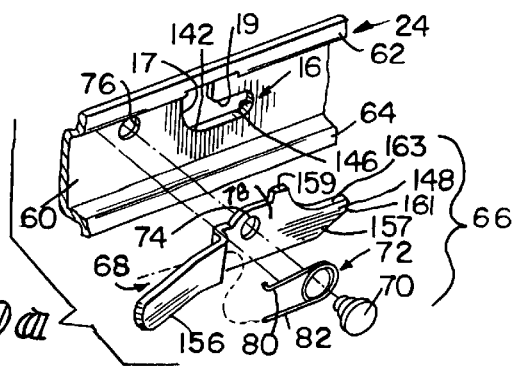
FIG. 10a is a perspective assembly view showing components in the pivotable, spring-biased, post-locking latch prior to mounting those components onto the wall of the chassis-support slide in close proximity to one of the L-shaped post-receiving slots.
Figure 11:
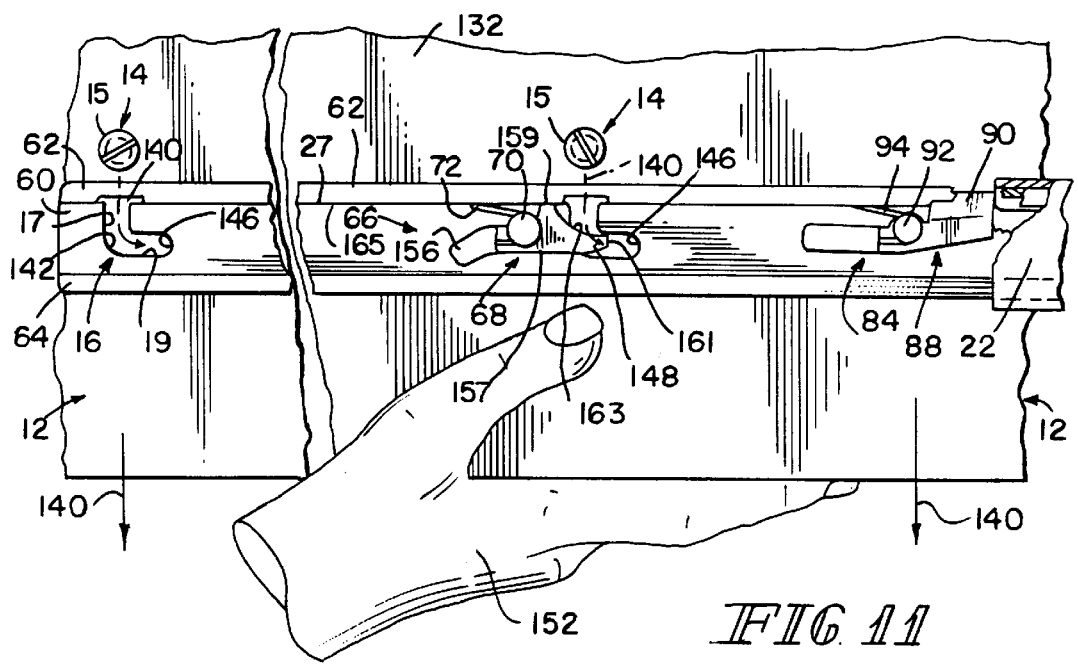
FIGS. 11–13 show a sequence in which certain of the mounting posts are lowered and locked into the L-shaped slots formed in one of the chassis-support slides.

Each L-shaped slot 16 includes a vertically extending entry portion 17 and a horizontally extending post-retainer portion 19 as shown best in FIGS. 10a, 10b, and 11. Entry portion 17 merges with post-retainer portion 19 at heel portion 142 and entry portion 17 communicates with inlet opening 25 formed in flange 27.

Figure 3A:
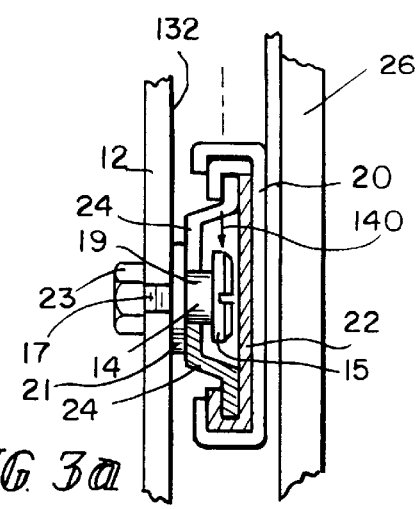
FIG. 3a is a section view taken along line 3a—3a of FIG. 3 showing the position of one of the mounting posts coupled to the chassis and received within one of the post-receiving slots formed in the chassis-support slide of the three-part telescoping slide assembly.

Each mounting post 14 includes a head 15 at one end, an anchor 17 at an opposite end, a throat 19 positioned to lie between head 15 and anchor 17, and a flange 21 positioned to lie between anchor 17 and throat 19 as shown, for example, in FIGS. 1 and 3a. In the illustrated embodiment, head 15 is slotted to accept a screwdriver blade, anchor 17 is threaded to engage a mounting nut 23 shown in FIG. 3a, and flange 21 is an enlarged annular disk coupled to throat 19 and shaped to resemble a washer.

Referring to FIGS. 1–3a, 7, and 10–13, it is apparent how easy it is for one person to position chassis 12 between two fully extended telescoping slide assemblies 136, 138, lower chassis 12 so that mounting posts 14 "drop" into L-shaped slots 16 formed in chassis-support slides 24 included in each of the telescoping slide assemblies 136, 138, and move chassis 12 in a forward direction 144 relative to chassis-support slides 24 to cause post-locking latches 66 mounted on each of the two chassis-support slides 24 to "lock" chassis 12 to chassis-support slides 24 included in telescoping slide assemblies 136, 138 without the need to use any tools. Release of mounting posts 14 from their "drop-and-lock" positions in L-shaped slots 16 to permit removal of chassis 12 from a mounted position on slide assemblies 136, 138 is just as easy and is shown, for example, in FIG. 14.

Throat 19 of mounting post 14 is sized to move easily in L-shaped slot 16, while head 15 and flange 21 each have a diameter that is greater than the width of the L-shaped slot 16. Chassis-support slide 24 is formed to include a "wide" inlet opening 25 in a horizontally extending flange 27 interconnecting upper lip 62 and wall 60 of chassis-support slide 24 (see FIGS. 9 and 10b) that is sized to accept head 15 so that mounting post 14 can be moved to pass throat 19 into and through L-shaped slot 16 formed in wall 60 and head 15 into and through inlet opening 25 formed in flange 27.

Each telescoping slide assembly 10 (136, 138) is typically formed to include a stationary slide 20, an intermediate slide 22, and a chassis-support slide 24, as shown in FIGS. 1 and 9. Each slide assembly 10 is fixed to a cabinet 18 and movable between a fully retracted position and a fully extended position relative to cabinet 18 so that chassis 12 may be stored within cabinet 18 as suggested by FIGS. 3–6. It is within the scope of this disclosure to use a telescoping slide assembly having two or more slide members and to provide a telescoping slide assembly having interconnected load-carrying and stationary slide members (without any intermediate slide member therebetween).

Stationary slide 20 is fixed within cabinet 18 by brackets 26. It is within the scope of this disclosure to include any type of bracket to couple stationary slide 20 to cabinet 18. Stationary slide 20 is coupled to brackets 26 by any suitable connector means 28 shown in FIG. 9. Stationary slide 20 is formed to include a wall 30, a top wall 32, and a bottom wall 34 each coupled to back wall 30, and first and second rims 36, 38 coupled to each of the top and bottom walls 32, 34, respectively. An upper channel 40 is formed by top wall 32 and first rim 36 and a lower channel 42 is formed by bottom wall 34 and second rim 38.

Intermediate slide 22 is similarly formed to include a wall 44, a top wall 46, and a bottom wall 48 each coupled to wall 44, and first and second rims 50, 52 coupled to each of the top and bottom walls 46, 48, respectively. An upper channel 54 is formed in an upper edge defined by top wall 46 and first rim 50 to receive an upper edge of load-carrying slide 24. A lower channel 56 is formed in a lower edge defined by bottom wall 48 and second rim 52 to receive a lower edge of load-carrying slide 24.

Intermediate slide 22 is received within stationary slide 20, as shown in FIG. 1, so that wall 30 of stationary slide 20 is positioned to lie adjacent to wall 44 of intermediate slide 22. Intermediate slide 22 is also movable relative to stationary slide 20.

Two plastic wear pads 58 are provided in telescoping slide assembly 10 as shown in FIG. 9. One plastic wear pad 58 is located between top wall 32 of stationary slide 20 and top wall 46 of intermediate slide 22. Another plastic wear pad 58 is located between bottom wall 34 of stationary slide 20 and bottom wall 48 of intermediate slide 22. Wear pads 58 are provided to act as a bearing between intermediate slide 22 and stationary slide 20 so that intermediate slide 22 may move freely relative to stationary slide 20. Wear pads 58 are made of "nylatron"; however, it is within the scope of this disclosure to include any type of bearing or a wear pad made of any suitable material in order to provide a low coefficient of friction between intermediate slide 22 and stationary slide 20.

Chassis-support slide 24 includes a wall 60, a horizontally extending flange 27 coupled to wall 60, an upper lip 62 coupled to flange 27, and a lower lip 64 also coupled to wall 60, as shown in FIGS. 1, 9, and 10b. Chassis-support 24 is coupled to and received within intermediate slide 22 such that upper lip 62 is received within upper channel 54 of intermediate slide 22 and lower lip 64 is received within lower channel 56 of intermediate slide 22. Rollers 65, as shown in FIG. 9, are provided between intermediate slide 22 and chassis-support slide 24. Rollers 65 act as bearings so that there is a low coefficient of friction making chassis-support slide 24 freely movable relative to intermediate slide 22. Chassis-support slide 24 is further formed to define "L-shaped" post-receiving slots 16, as mentioned above, in wall 60, as shown, for example, in FIG. 10b. Slots 16 are formed to receive mounting posts 14 as shown in FIGS. 1 and 11–13.

Each telescoping slide assembly 10 further includes a post-locking latch 66 as shown in FIGS. 1, 9, and 10–14. Post-locking latch 66 is coupled to wall 60 of chassis-support slide 24 and includes a lock body 68, a pivot pin 70, and a spring 72. As shown in FIG. 10, lock body 68 and wall 60 are each formed to include an aperture 74, 76, respectively, for receiving pin 70 therethrough. Lock body 68 is positioned to lie adjacent to wall 60 and spring 72 is positioned to lie around pin 70 adjacent to a front face 78 of lock body 68. A first end 80 of spring 72 is coupled to flange 27 adjacent to upper lip 62 of chassis-support slide 24. First end 80 is received within an aperture (not shown) of flange 27. A second end 82 of spring 72 is coupled to lock body 68 by being passed through an aperture (not shown) formed in lock body 68.

Lock body 66 includes a tip portion 148 at one end, a handle 156 at another end, and a pivot mount 157 located between the tip portion 148 and handle 156. Pivot mount 157 is formed to include the aperture 74 containing pivot pin 70. Tip portion 148 serves as a "gate" that is able to move relative to chassis-support slide 24 to control entry of a mounting post 14 into (and exit of the mounting post 14 from) the L-shaped post-receiving slot 16 associated with lock body 66, as shown in FIGS. 11–14, and, in the illustrated embodiment, the gate established by lock body 66 is spring-loaded and pivots about pivot pin 70.

Tip portion 148 includes a stop 159, a post blocker 161, and a contact surface 163 positioned to lie between stop 159 and post blocker 161 as shown in FIGS. 1 and 10. Stop 159 is arranged to engage an underside 165 of flange 27 of chassis-support slide 24 in response to a biasing force generated by spring 72 to limit pivoting movement of lock body 68 and position tip portion 148 in a slot-closing position in L-shaped post-receiving slot 16 as shown, for example, in FIGS. 11 and 13. Post blocker 161 is arranged to block exit of mounting post 14 from post-receiving slot 16 when chassis 12 is mounted on chassis-support slide 24 and lock body 68 is pivoted to its slot-closing position as shown, for example, in FIG. 13. Mounting post 14 acts to pivot the spring-biased lock body 66 (temporarily) to a slot-opening position as shown, for example, in FIG. 12 during mounting of chassis 12 on chassis-support slide 24 upon engagement of throat 17 of the downwardly moving mounting post 14 on the curved contact surface 163 provided on tip portion 148 to permit entry of mounting post 14 (past post-locking latch 66) into a toe or post-retainer portion 146 of L-shaped post-receiving slot 16.

Figure 4:
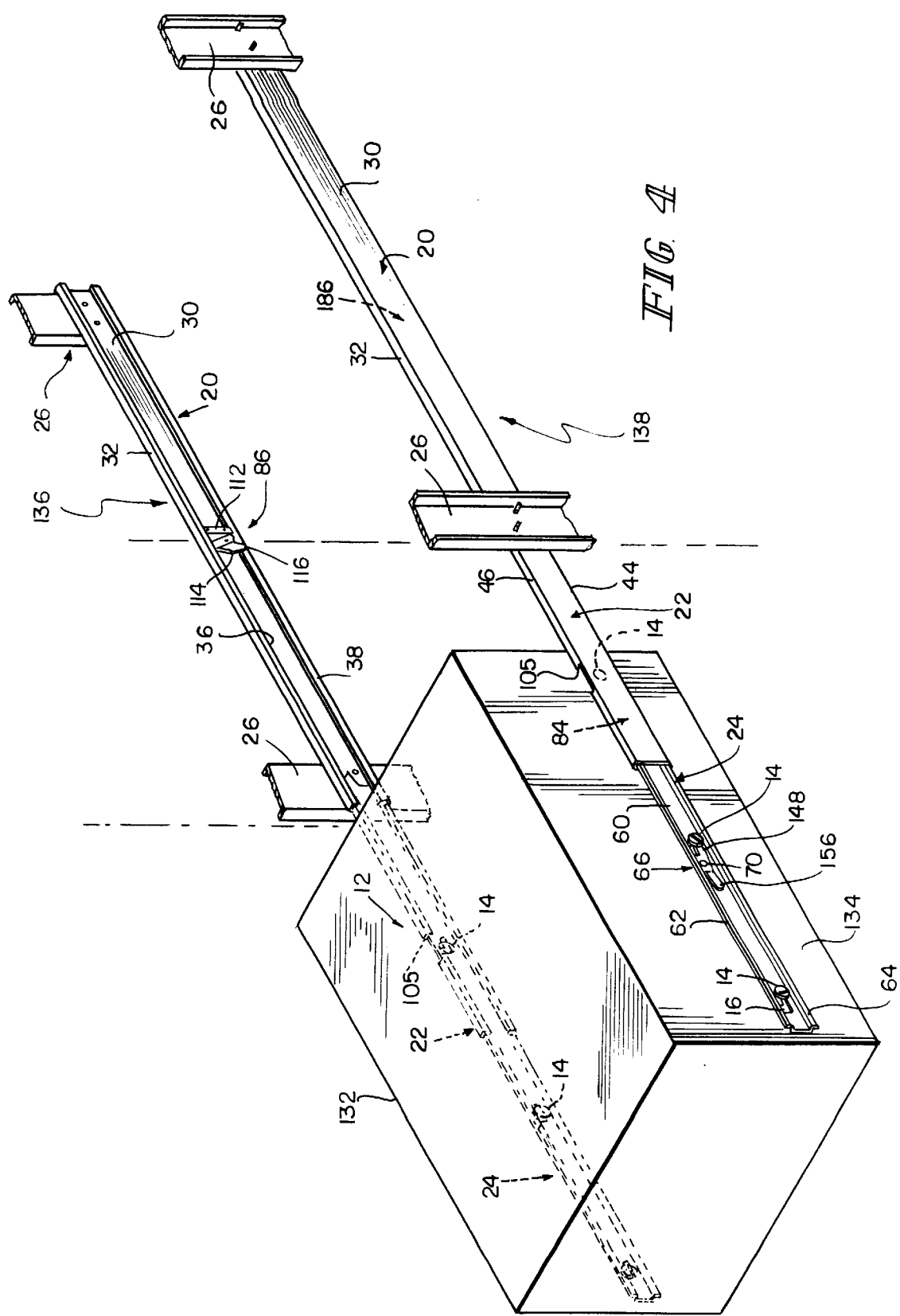
Figure 5:
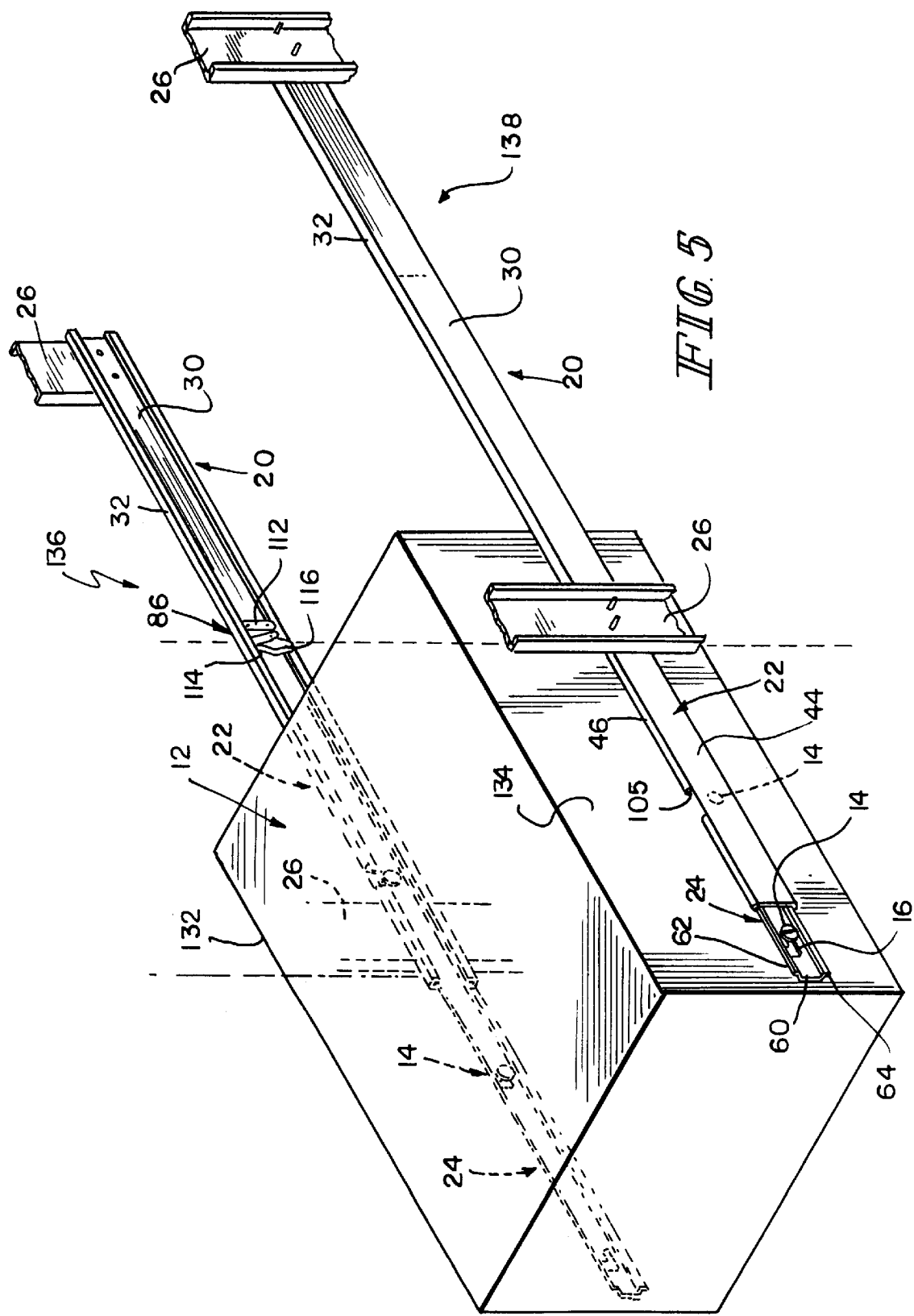

As shown in FIG. 9, each telescoping slide assembly 10 further includes a chassis-support slide lock 84 and an intermediate slide-lock 86. Chassis-support slide lock 84 is configured to lock chassis-support slide 24 to intermediate slide 22 (as shown in FIGS. 8 and 11–14) to prevent chassis-support slide 24 from retracting back within intermediate slide 22 when telescoping slide assembly 10 is in the fully extended position, as shown, for example, in FIGS. 8 and 11. Intermediate slide lock 86 is provided for locking intermediate slide 22 to stationary slide 20 when intermediate slide 22 reaches its fully extended position as shown in FIGS. 4, 5, and 8.

Chassis-support slide lock 84 is coupled to chassis-support slide 24 and includes a body 88 having an upper protrusion 90, a pin 92, and a spring 94. Body 88 is coupled to wall 60 of chassis-support slide 24 by pin 92 which is received within an aperture 96 of body 88 and an aperture 98 of chassis-support slide 24. Spring 94 includes a first end 100 coupled to horizontal flange 27 of chassis-support slide 24 and a second end 102 coupled to body 88. An aperture 104 is provided in upper lip 62 of chassis-support slide 24 normally to receive upper protrusion 90 therethrough as shown in FIG. 8.

Intermediate slide lock 86 is coupled to wall 44 of intermediate slide 22. Intermediate slide lock 86 includes a plate 110, an end plate 112, a body 114 having a catch portion 116, a pin 118, and a spring 120. As shown in the exploded view in FIG. 9, plate 110 and end plate 112 are coupled to wall 44 of intermediate slide 44 by rivets 122. Body 114 is mounted to plate 110 by pin 118 about which body 114 is pivotable. Pin 118 is received within an aperture 124 of body 114, an aperture 126 of plate 110, and an aperture 128 of wall 44 of intermediate slide 22. Catch portion 116 of body 114 is biased normally to be received within a cut-out portion 130 of stationary slide 20.

As mentioned before, the slides 22 and 24 in each telescoping slide assembly 10 are movable between a fully retracted position, wherein intermediate slide section 22 is received fully within stationary slide 20 and chassis-support slide 24 is received fully within intermediate slide 22, and a fully extended position, shown in FIG. 2, wherein each slide 20, 22, 24 is extended fully with respect to one another. As the slides in slide assembly 10 move from the fully retracted position to the fully extended position, chassis-support slide 24 remains positioned fully within intermediate slide 22 and does not move relative to intermediate slide 22. Only intermediate slide 22 (with chassis-support slide 24) initially moves relative to stationary slide 20. Wear pads 58 are provided to reduce friction between intermediate slide 22 and stationary slide 20.

Once intermediate slide 22 has moved to its fully extended position relative to stationary slide 20, body 114 of intermediate slide lock 86 is biased normally by spring 120 to pivot on pin 118 so that catch portion 116 of body 114 is received within cut-out portion 130 of stationary slide 20, as shown in FIGS. 4 and 8. Intermediate slide lock 86 prevents intermediate slide 22 from moving relative to stationary slide 20. Chassis-support slide 24 may now be moved relative to intermediate slide 22 toward the fully extended position. Once chassis-support slide 24 has moved to its fully extended position relative to intermediate slide 22, body 88 of chassis-support slide lock 84 is biased normally by spring 94 on pin 92 so that upper protrusion 90 extends through aperture 98 of chassis-support slide 24, as shown in FIG. 8. Chassis-support slide 24 is thus prevented from moving relative to intermediate slide 22.

In order to retract intermediate telescoping slide assembly 10 into stationary slide 20, body 88 of chassis-support slide lock 84 must be pivoted manually on pin 92 against the spring bias to remove upper protrusion 90 from aperture 98 in order to allow chassis-support slide 24 to move relative to intermediate slide 22. Once chassis-support slide 24 moves to a fully retracted position within intermediate slide 22, a cam portion 160 of chassis-support slide 24 moves to engage body 114 of intermediate slide lock 86 and pivot body 114 on pin 118 against the spring bias in order to remove catch portion 114 from cut-out portion 130 of stationary slide 20 to allow intermediate slide 22 (and the chassis-support slide 24 therein) to move relative to stationary slide 20 toward the fully retracted position in stationary slide 20.

In order to mount chassis 12 to telescoping slide assemblies 10, three mounting posts 14 are coupled to a right side 132 of chassis 12 and three mounting posts 14 are coupled to a left side 134 of chassis 12. Mounting posts 14 are shown to be shoulder screws, however, it is within the scope of this disclosure to include any type of post mounted to right and left sides 132, 134 of chassis 12. Posts 14 coupled to right side 132 of chassis 12 are provided to correspond with a right-side telescoping slide assembly 136 (of a cooperating pair of telescoping slide assemblies 10 coupled to cabinet 18) and posts 14 coupled to left side 134 of chassis 12 are provided to correspond with a left-side telescoping slide assembly 138, as shown in FIGS. 1, 2, and 4–7.

As shown in FIG. 2, stationary slide 20 of each telescoping slide assembly 136, 138 is coupled to cabinet 18 by brackets 26 which are shown diagrammatically in FIG. 4. When telescoping slide assemblies 136, 138 are in the fully extended position, all three post-receiving slots 16 of each chassis-support slide 24 are exposed so that chassis 12 may be lowered between each of the right-side and left-side telescoping slide assemblies 136, 138. Each mounting post 14 is thus received within a corresponding post-receiving slot 16. FIGS. 7 and 11, for example, show chassis 12 being lowered in a downward direction 140 in order for posts 14 to be received within companion slots 16 formed in chassis-support slides 24.

Figure 12:
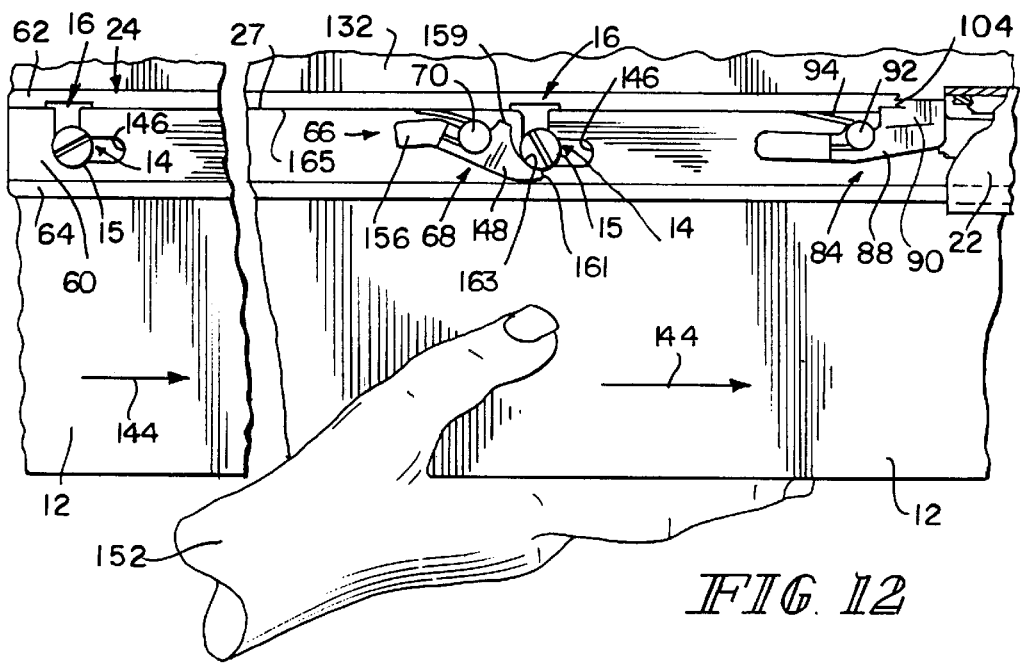
Figure 13:
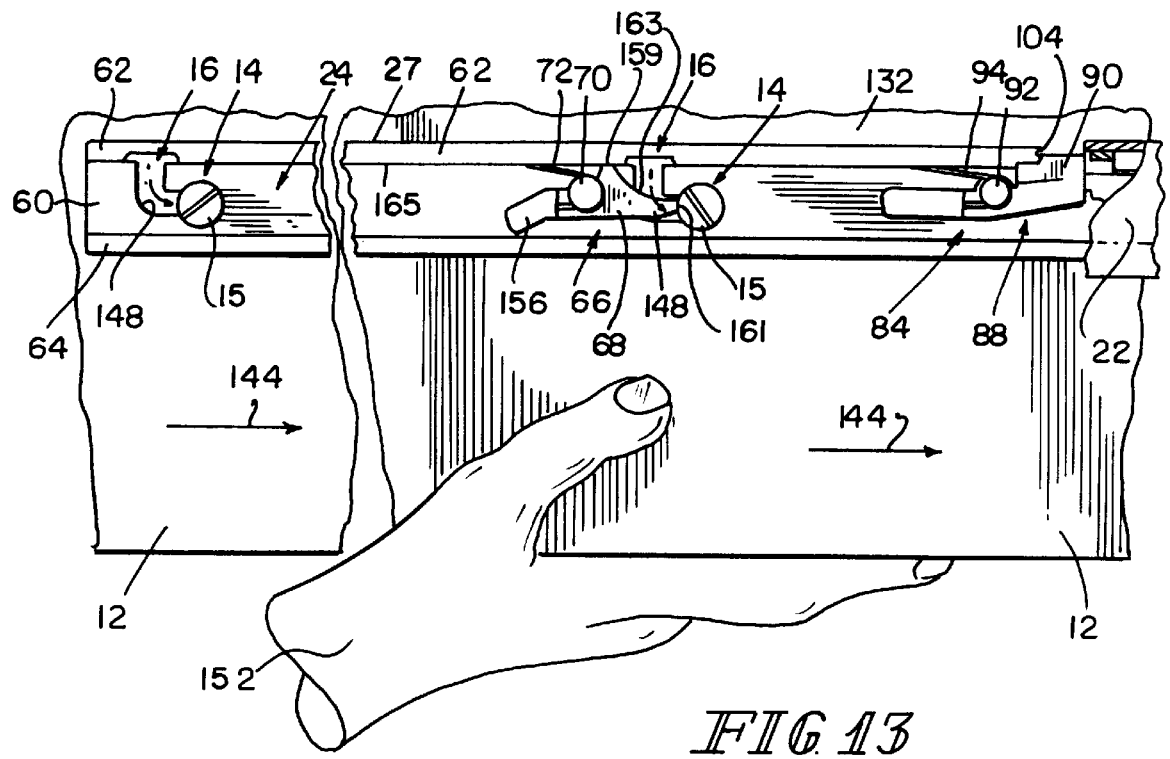

As chassis 12 is lowered between right and left telescoping slide assemblies 136, 138 and each mounting post 14 is being received within each corresponding post-receiving slot 16, as shown in FIG. 11, a middle mounting post 14 is urged to engage the lock body 68 of post-locking latch 66. The downward force of mounting post 14 causes lock body 68 to pivot about pin 70 so that mounting post 14 is positioned to rest at a heel portion 142 of post-receiving slot 16, as shown in FIG. 12. Chassis 12 may now be moved inward toward cabinet 18 in direction 144 relative to slide assembly 10, as shown in FIG. 12, until mounting post 14 is positioned to rest at a toe or post-retainer portion 146 of post-receiving slot 16. Once mounting post 14 is positioned to rest at a toe portion 146 of post-receiving slot 16, lock body 68 is normally biased so that a post blocker 161 of tip portion 148 of lock body 68 is positioned to lie adjacent to mounting post 14 and prevent mounting post 14 from exiting from post-receiving slot 16. Once chassis 12 is mounted on each telescoping slide assembly 10, chassis 12, and the slides 22, 24 in and slide assemblies 136, 138 may be moved in direction 150 toward the fully retracted position within cabinet 18, as shown in FIGS. 3 and 4–6.

Figure 14:
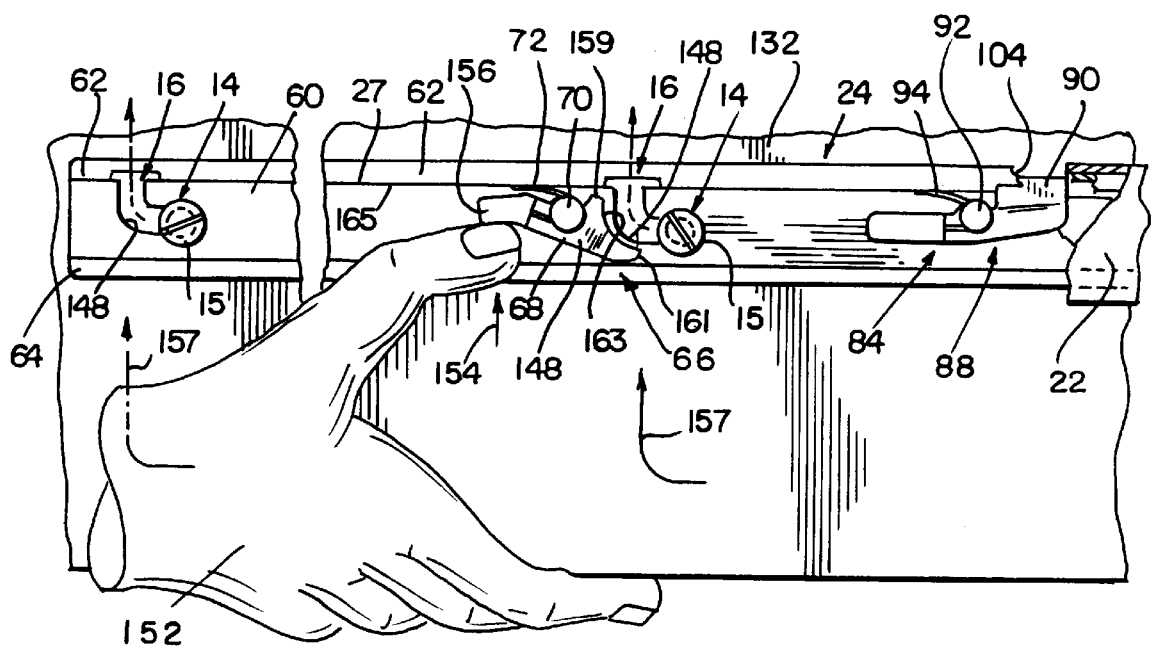
FIG. 14 shows manual movement of one of the post-locking latches to a slot-opening position to permit removal of the chassis from a mounted position on the chassis-support slide of the telescoping slide assembly.

In order to release chassis 12 from telescoping slide assemblies 136, 138, post-locking latch 66 is released by a user 152, as shown in FIG. 14. User 152 pushes generally upwardly in direction 154 on a back end 156 of lock body 68 against the bias of spring 72 in order to lower post blocker 161 of tip portion 148 away from mounting post 14 and "open" the post-receiving slot 16. User 152 may then move chassis 12 back and up as shown by arrows 157 so that mounting post 14 is moved from toe portion 146 of post-receiving slot 16 to heel portion 142 of post-receiving slot 16 and out of post-receiving slot 16 through the vertically extending entry portion of slot 16.

Although the invention has been described in detail with reference to certain preferred embodiments, variations and modifications exist within the scope and spirit of the invention as described and defined in the following claims.

What is claimed is:

1. A telescoping slide assembly for the mounting of an equipment mounting support, the assembly comprising an elongated stationary slide member having two ends, an elongated movable load-carrying slide member having two ends, the load-carrying slide member being telescopically connected to the stationary slide member so as to have one end of the load-carrying slide member extended away from one end of the stationary slide member in an extended position and the one end of the load-carrying slide member movable telescopically with respect to the stationary slide member to a retracted position wherein the one end of the load-carrying slide member is telescopically withdrawn into the stationary slide member so as to be located adjacent to the one end of the stationary slide member, the load-carrying slide member being provided with at least two post-engaging slots, wherein the load-carrying slide member post-engaging slots are provided with an offset opening and with a support surface adapted to receive and support mounting posts on an equipment mounting support to provide a coupling for the equipment mounting support to the telescopic slide assembly, and a lock to block removal of the mounting post through the opening.

2. The assembly of claim 1, wherein the slots have an entry portion that extends downwardly from a top side of the elongated movable load-carrying slide member to provide an entry opening for the mounting posts.

3. The assembly of claim 2, wherein the slots have angled portion adjacent the entry portion for supporting the mounting posts.

4. The assembly of claim 1, wherein the elongated load-carrying slide member has a movable lock element mounted thereon to block withdrawal of a mounting post after insertion of a mounting post into the post-engaging slot.

5. A telescoping slide assembly for the mounting of an equipment mounting support, the assembly comprising an elongated stationary slide member having two ends, an elongated movable load-carrying slide member having two ends, the load-carrying slide member being telescopically connected to the stationary slide member so as to have one end of the load-carrying slide member extended away from one end of the stationary slide member in an extended position and the one end of the load-carrying slide member movable telescopically with respect to the stationary slide member to a retracted position wherein the one end of the load-carrying slide member is telescopically withdrawn into the stationary slide member so as to be located adjacent to the one end of the stationary slide member, the load-carrying slide member being provided with at least two post-engaging slots, wherein the load-carrying slide member post-engaging slots are provided with a support surface adapted to receive and support mounting posts on an equipment mounting support to provide a coupling for the equipment mounting support to the telescopic slide assembly, and wherein the elongated load-carrying slide member has a movable lock element mounted thereon to block withdrawal of a mounting post after insertion of a mounting post into the post-engaging slot.

6. The assembly of claim 5, wherein the movable lock element is a lever pivotably mounted on the elongated movable load-carrying slide member to move between a position where the lever blocks movement of the post along the slot after insertion and a position unblocking movement of the post out of the slot to release the equipment mounting support.

7. The telescopic slide of claim 6, wherein the pivotable lever is spring biased to the slot-blocking position.

8. The telescopic slide of claim 7, wherein insertion of the posts through the entry position of the slot causes the post to contact the spring-biased lever to move the lever initially to the unblocking position and subsequent movement of the post along the slot releases contact of the post and lever to allow the lever bias to return the lever to its blocking position locking the post in the slot.

9. The telescopic slide of claim 6, wherein the pivotable lever is spring biased to the slot-blocking position, and wherein the load-carrying slide member is formed to include a second slot adapted to receive a mounting post coupled to a piece of equipment to be carried on the load-carrying slide member and further comprising a slide lock coupled to the load-carrying slide member and configured to lock the load-carrying slide member to the intermediate slide member to prevent the load-carrying slide member from retracting back with the intermediate slide member upon movement of the load-carrying slide member to the fully extended position and wherein the slide lock is positioned to lie between the first and second slots.

10. The assembly of claim 9, wherein the intermediate slide includes an upper edge formed to include an upper channel receiving an upper edge of the load-carrying slide member during motion of the load-carrying slide member relative to the intermediate slide member and the upper edge of the intermediate slide member is formed to include a post-entry channel positioned to lie above an inlet into the second slot to permit insertion of a mounting post into the second slot.

11. The assembly of claim 9, wherein the second slot is L-shaped and the load-carrying slide member is formed to include a vertically extending entry portion arranged to lie in spaced-apart parallel relation to the vertically extending entry portion of the first slot and a horizontally extending post-retainer portion communicating with the vertically extending entry portion of the second slot.

12. A telescoping slide assembly for the mounting of an equipment mounting support, the assembly comprising an elongated stationary slide member having two ends, an elongated movable load-carrying slide member having two ends, the load-carrying slide member being telescopically connected to the stationary slide member so as to have one end of the load-carrying slide member extended away from one end of the stationary slide member in an extended position and the one end of the load-carrying slide member movable telescopically with respect to the stationary slide member to a retracted position wherein the one end of the load-carrying slide member is telescopically withdrawn into the stationary slide member so as to be located adjacent to the one end of the stationary slide member, the load-carrying slide member being provided with at least two post-engaging slots, wherein the load-carrying slide member post-engaging slots are provided with a support surface adapted to receive and support mounting posts on an equipment mounting support to provide a coupling for the equipment mounting support to the telescopic slide assembly, wherein the slots have an entry portion that extends downwardly from a top side of the elongated movable load-carrying slide member to provide an entry opening for the mounting posts, wherein the slots have an angled portion adjacent the entry portion for supporting the mounting posts, and wherein the elongated load-carrying slide member has a movable lock element mounted thereon to block withdrawal of a mounting post after insertion of a mounting post into the post-engaging slot.

13. The assembly of claim 12, wherein the movable lock element is a lever pivotably mounted on the elongated movable load-carrying slide member to move between a position where the lever blocks movement of the post along the slot after insertion and a position unblocking movement of the post out of the slot to release the equipment mounting support.

14. The telescopic slide of claim 13, wherein the pivotable lever is spring biased to the slot-blocking position.

15. The telescopic slide of claim 14, wherein insertion of the posts through the entry position of the slot causes the post to contact the spring-biased lever to move initially the lever to the unblocking position and subsequent movement of the post along the slot releases contact of the post and lever to allow the lever bias to return the lever to its blocking position locking the post in the slot.

16. A telescoping slide assembly for the mounting of an equipment mounting support, the assembly comprising an elongated stationary slide member having two ends, an elongated movable load-carrying slide member having two ends, the load-carrying slide member being telescopically connected to the stationary slide member so as to have one end of the load-carrying slide member extended away from one end of the stationary slide member in an extended position and the one end of the load-carrying slide member movable telescopically with respect to the stationary slide member to a retracted position wherein the one end of the load-carrying slide member is telescopically withdrawn into the stationary slide member so as to be located adjacent to the one end of the stationary slide member, the load-carrying slide member being provided with at least two post-engaging slots, wherein the load-carrying slide member post-engaging slots are provided with a support surface adapted to receive and support mounting posts on an equipment mounting support to provide a coupling for the equipment mounting support to the telescopic slide assembly, wherein the elongated load-carrying slide member has a movable lock element mounted thereon to block withdrawal of a mounting post after insertion of a mounting post into the post-engaging slot, and wherein the movable lock element is a lever pivotably mounted on the elongated movable load-carrying slide member to move between a position where the lever blocks movement of the post along the slot after insertion and a position unblocking movement of the post out of the slot to release the equipment mounting support.

17. The telescopic slide of claim 16, wherein the pivotable lever is spring biased to the slot-blocking position.

18. The telescopic slide of claim 17, wherein insertion of the posts through the entry position of the slot causes the post to contact the spring-biased lever to move the lever initially to the unblocking position and subsequent movement of the post along the slot releases contact of the post and lever to allow the lever bias to return the lever to its blocking position locking the post in the slot.

19. A telescoping slide assembly comprising interconnected load-carrying, intermediate, and stationary slide members movable relative to one another to extend and retract the load-carrying and intermediate slide members relative to the stationary slide member between fully extended and retracted positions, the load-carrying slide member being formed to include a first slot adapted to receive a mounting post coupled to a piece of equipment to be carried on the load-carrying slide member, and a latch mounted to the load-carrying slide member and arranged to move from a slot-closing position blocking exit of a mounting post in the first slot from the first slot and a slot-opening position allowing movement of a mounting post into and out of the first slot.

20. The assembly of claim 19, further comprising a mounting post adapted to be mounted on a piece of equipment and sized to be received in the first slot to support the piece of equipment on the load-carrying slide member, the mounting post including a head at one end, an anchor adapted to be mounted on a piece of equipment at the other end, and a throat positioned to lie between the head and the anchor and sized to pass through the first slot.

21. A telescoping slide assembly comprising interconnected load-carrying, intermediate, and stationary slide members movable relative to one another to extend and retract the load-carrying and intermediate slide members relative to the stationary slide member between fully extended and retracted positions, the load-carrying slide member being formed to include a first slot adapted to receive a mounting post coupled to a piece of equipment to be earned on the load-carrying slide member, and a latch coupled to the load-carrying slide member and arranged to move from a slot-closing position blocking exit of a mounting post in the first slot from the first slot and a slot-opening position allowing movement of a mounting post into and out of the first slot, and wherein the first slot is L-shaped and the load-carrying slide member is formed to provide the first slot with a vertically extending entry portion and a horizontally extending post-retainer portion communicating with the vertically extending entry portion and extending horizontally in a direction toward the intermediate slide member.

22. The assembly of claim 21, wherein the load-carrying slide member includes a vertically extending wall formed to include the L-shaped first slot, a vertically extending upper lip arranged to engage and slide in an upper channel formed in the intermediate slide member during motion of the load-carrying slide member relative to the intermediate slide member, and a horizontally extending flange arranged to interconnect the vertically extending wall and upper lip and formed to include an inlet opening into the vertically extending entry portion of the L-shaped first slot.

23. The assembly of claim 22, wherein the latch includes a tip portion configured to engage an underside surface of the horizontally extending flange and extend across a width portion of the L-shaped slot when the latch is moved to assume the slot-closing position to block exit of a mounting post received in the horizontally extending post-retainer portion of the L-shaped first slot.

24. The assembly of claim 22, wherein the inlet opening formed in the horizontally extending flange has a width extending along a portion of the length of the load-carrying slide member and the vertically extending entry portion of the L-shaped first slot has a width that is less than the width of the inlet opening.

25. The assembly of claim 21, wherein the latch includes a tip portion positioned to lie in the vertically extending entry portion upon movement of the latch to assume the slot-closing position.

26. The assembly of claim 25, wherein the latch includes a lock body formed to include the tip portion and a pivot pin coupled to the load-carrying slide member and arranged to support the lock body to pivot about the pivot pin and the tip portion is positioned to lie outside of the vertically extending entry portion of the L-shaped first slot upon pivoted movement of the lock body about the pivot pin to assume the slot-opening position.

27. The assembly of claim 25, wherein the tip portion is arranged to include a contact surface arranged to face toward an inlet opening into the vertically extending entry portion and adapted to be engaged by a mounting post moving in the L-shaped first slot during movement of the latch from the slot-closing position to the slot-opening position.

28. A telescoping slide assembly comprising interconnected load-carrying, intermediate, and stationary slide members movable relative to one another to extend and retract the load-carrying and intermediate slide members relative to the stationary slide member between fully extended and retracted positions, the load-carrying slide member being formed to include a first slot adapted to receive a mounting post coupled to a piece of equipment to be carried on the load-carrying slide member, a latch coupled to the load-carrying slide member and arranged to move from a slot-closing position blocking exit of a mounting post in the first slot from the first slot and a slot-opening position allowing movement of a mounting post into and out of the first slot, and wherein the load-carrying slide member includes a vertically extending wall formed to include the first slot and the latch is coupled to the vertically extending wall.

29. The assembly of claim 28, wherein the back wall is formed to include a second slot adapted to receive another mounting post and positioned to lie in spaced-apart relation to the first slot.

30. The assembly of claim 28, wherein the load-carrying slide member further includes a vertically extending upper lip arranged to engage and slide in an upper channel formed in the intermediate slide member during motion of the load-carrying slide member relative to the intermediate slide member and a horizontally extending flange arranged to interconnect the vertically extending wall and upper lip and formed to include an inlet opening into the first slot.

31. The assembly of claim 30, wherein the latch includes a post blocker arranged to block exit of a mounting post received in the first slot upon movement of the latch to the slot-closing position and a stop arranged to engage an underside of the horizontally extending flange upon movement of the latch to the slot-closing position.

32. The assembly of claim 31, wherein the latch further includes a contact surface positioned to lie between the post blocker and the stop and arranged to be engaged by a mounting post moving in the first slot during movement of the latch from a slot-closing position to a slot-opening position.

33. A telescoping slide assembly comprising interconnected load-carrying, intermediate, and stationary slide members movable relative to one another to extend and retract the load-carrying and intermediate slide members relative to the stationary slide member between fully extended and retracted positions, the load-carrying slide member being formed to include a first slot adapted to receive a mounting post coupled to a piece of equipment to be carried on the load-carrying slide member, a latch coupled to the load-carrying slide member and arranged to move from a slot-closing position blocking exit of a mounting post in the first slot from the first slot and a slot-opening position allowing movement of a mounting post into and out of the first slot, further comprising a mounting post adapted to be mounted on a piece of equipment and sized to be received in the first slot to support the piece of equipment on the load-carrying slide member, the mounting post including a head at one end, an anchor adapted to be mounted on a piece of equipment at the other end, and a throat positioned to lie between the head and the anchor and sized to pass through the first slot, and wherein the mounting post further includes a flange positioned to lie between the anchor and the throat.

34. The assembly of claim 33, wherein the throat is a cylindrical member having a first diameter and the flange is an annular member having a second diameter greater than the first diameter.

35. A telescoping slide assembly comprising interconnected load-carrying intermediate, and stationary slide members movable relative to one another to extend and retract the load-carrying and intermediate slide members relative to the stationary slide member between fully extended and retracted positions, the load-carrying slide member being formed to include a first slot adapted to receive a mounting post coupled to a piece of equipment to be carried on the load-carrying slide member, a latch coupled to the load-carrying slide member and arranged to move from a slot-closing position blocking exit of a mounting post in the first slot from the first slot and a slot-opening position allowing movement of a mounting post into and out of the first slot, further comprising amounting post adapted to be mounted on apiece of equipment and sized to be received in the first slot to support the piece of equipment on the load-carrying slide member, the mounting post including a head at one end, an anchor adapted to be mounted on a piece of equipment at the other end, and a throat positioned to lie between the head and the anchor and sized to pass through the first slot, and wherein the load-carrying slide member is formed to provide the first slot with a vertically extending entry portion, the load-carrying slide member includes a vertically extending wall formed to include the first slot, a vertically extending upper lip arranged to engage and slide in an upper channel formed in the intermediate slide member during motion of the load-carrying slide member and the intermediate slide member, and a horizontally extending flange arranged to interconnect the vertically extending wall and upper lip and formed to include an inlet opening into the vertically extending entry portion of the first slot, the throat is a cylindrical member having a first diameter and the flange is an annular member having a second diameter greater than the first diameter, and the head has a width that is less than the width of the inlet opening and greater than the width of the vertically extending entry portion to permit passage of the head through the inlet opening during passage of the throat into the vertically extending entry portion.

36. A telescoping slide assembly comprising a mounting post adapted to be coupled to a side wall of a chassis, interconnected load-carrying and stationary slide members movable relative to one another to extend and retract the load-carrying slide member relative to the stationary slide member between fully extended and retracted positions, the load-carrying member being formed to include a two-leg slot receiving the mounting post therein and including an entry leg and a post-retainer leg, and a latch coupled to the load-carrying slide member and arranged to move relative to the load-carrying slide member from a slot-closing position retaining the mounting post in the post-retainer leg of the two-leg slot to a slot-opening position allowing movement of the mounting post into and out of the post-retainer leg via the entry leg.

37. A telescoping slide assembly comprising first and second mounting posts adapted to be coupled to a side wall of a chassis to lie in spaced-apart relation to one another, interconnected load-carrying and stationary slide members movable relative to one another to extend and retract the load-carrying slide member relative to the stationary slide member between fully extended and retracted positions, the load-carrying member being formed to include a first slot receiving the first mounting post therein and a second slot receiving the second mounting post therein, and a latch mounted to the load-carrying slide member and arranged to move relative to the load-carrying slide member from a slot-closing position retaining the first mounting post in the first slot and a slot-opening position allowing movement of the first mounting post into and out of the first slot.

38. A telescoping slide assembly comprising interconnected load-carrying and stationary slide members movable relative to one another to extend and retract the load-carrying slide member relative to the stationary slide member between fully extended and retracted positions, the load-carrying slide member being formed to include a first slot adapted to receive a mounting post coupled to a piece of equipment to be carried on the load-carrying slide member, and a latch mounted to the load-carrying slide member and arranged to move from a slot-closing position blocking exit of a mounting post in the first slot from the first slot and a slot-opening position allowing movement of a mounting post into and out of the first slot.

39. A telescoping slide assembly comprising interconnected load-carrying and stationary slide members movable relative to one another to extend and retract the load-carrying slide member relative to the stationary slide member between fully extended and retracted positions, the load-carrying slide member being formed to include a first slot adapted to receive a mounting post coupled to a piece of equipment to be carried on the load-carrying slide member, and a latch coupled to the load-carrying slide member and arranged to move from a slot-closing position blocking exit of a mounting post in the first slot from the first slot and a slot-opening position allowing movement of a mounting post into and out of the first slot, and wherein the first slot is L-shaped and the load-carrying slide member is formed to provide the first slot with a vertically extending entry portion and a horizontally extended post-retainer portion communicating with the vertically extending entry portion and extending horizontally in a direction toward the intermediate slide member.

\* \* \* \* \*